United States Patent
Maki et al.

(10) Patent No.: US 8,127,191 B2
(45) Date of Patent: Feb. 28, 2012

(54) CONTROL METHOD FOR SEMICONDUCTOR INTEGRATED CIRCUIT AND SEMICONDUCTOR INTEGRATED CIRCUIT

(75) Inventors: Takashi Maki, Tokyo (JP); Daisuke Tsukuda, Tokyo (JP); Tetsuya Hiramatsu, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 109 days.

(21) Appl. No.: 12/643,874

(22) Filed: Dec. 21, 2009

(65) Prior Publication Data
US 2010/0218057 A1  Aug. 26, 2010

(30) Foreign Application Priority Data
Feb. 25, 2009  (JP) .................................. 2009-43042

(51) Int. Cl.
| G01R 31/28 | (2006.01) |
| G01R 31/3187 | (2006.01) |
| G01R 27/28 | (2006.01) |
| G01R 31/00 | (2006.01) |
| G01R 31/14 | (2006.01) |
| G11C 7/00 | (2006.01) |
| G11C 29/00 | (2006.01) |
| G11C 7/02 | (2006.01) |

(52) U.S. Cl. ........ 714/733; 714/724; 365/201; 365/208; 702/117; 702/118; 702/119; 702/120; 324/750.3

(58) Field of Classification Search ....................... None
See application file for complete search history.

(56) References Cited

U.S. PATENT DOCUMENTS

| 5,579,271 | A |   | 11/1996 | Sohn et al. |
| 7,590,016 | B2 | * | 9/2009 | Ishikawa et al. ............. 365/201 |
| 7,730,375 | B1 | * | 6/2010 | Russell ........................ 714/733 |
| 2002/0069382 | A1 | * | 6/2002 | Hayashi et al. .............. 714/715 |
| 2003/0005373 | A1 | * | 1/2003 | Michael ....................... 714/719 |
| 2003/0035328 | A1 |   | 2/2003 | Hamamatsu et al. |
| 2005/0120270 | A1 | * | 6/2005 | Anand et al. ................... 714/30 |
| 2005/0166111 | A1 | * | 7/2005 | Chien ........................... 714/733 |
| 2005/0289423 | A1 | * | 12/2005 | Yabuta ......................... 714/733 |
| 2007/0245200 | A1 | * | 10/2007 | Hattori et al. ................ 714/742 |
| 2008/0103719 | A1 | * | 5/2008 | Seong ........................... 702/125 |
| 2010/0037108 | A1 | * | 2/2010 | Choi ............................. 714/718 |

FOREIGN PATENT DOCUMENTS

| JP | 8-273396 A | 10/1996 |
| JP | 2003-59297 A | 2/2003 |

* cited by examiner

*Primary Examiner* — Jeffrey A Gaffin
*Assistant Examiner* — Guerrier Merant
(74) *Attorney, Agent, or Firm* — Arent Cox LLP (57) ABSTRACT

A semiconductor integrated circuit includes a self-test circuit, wherein, when a operation mode of the self-test circuit has been switched from a low-speed operation mode to a high-speed operation mode, processing is performed in the high-speed operation mode during a given time period, and the processing result is invalidated based on a control signal.

20 Claims, 10 Drawing Sheets

CONTROL METHOD FOR SEMICONDUCTOR INTEGRATED CIRCUIT AND SEMICONDUCTOR INTEGRATED CIRCUIT

CROSS-REFERENCE TO RELATED APPLICATION

This application is based upon and claims the benefit of priorities of the prior Japanese Patent Application No. 2009-043042, filed on Feb. 25, 2009, the entire contents of which are incorporated herein by reference.

FIELD

The embodiments discussed herein relate to a control method for a semiconductor integrated circuit and a semiconductor integrated circuit.

BACKGROUND

In recent years, semiconductor integrated circuits (LSIs, chips) have been highly functionalized and highly integrated. For example, the number of RAMs (RAM blocks) mounted on one LSI has been increased.

Such an LSI includes a built-in-self-test (BIST) circuit so that a plurality of RAMs mounted on the LSI are tested by the LSI itself.

When testing a plurality of RAMs mounted on the LSI, the plurality of RAMs are simultaneously tested in order to shorten a test time period, and further tests are performed at a high speed using the system's frequency (operating frequency of the LSI).

As semiconductor integrated circuits having a test mode, various ones have hitherto been proposed. Among them, for example, there are semiconductor integrated circuits that test a plurality of RAMs simultaneously as well at high speeds at respective system's frequencies.

However, for example, simultaneously testing a plurality of RAMs at a high frequency might disturb a power supply waveform to thereby cause power supply noise, which would make it impossible to perform exact tests.

That is, for example, when simultaneously testing a plurality of RAMs in a semiconductor integrated circuit, exact tests have been infeasible due to power supply noise, which has raised a problem in that it is impossible to correctly sort out the RAMs into conforming products and nonconforming products, resulting in a reduced yield.

SUMMARY

According to an aspect of the embodiments, a semiconductor integrated circuit includes a self-test circuit, wherein, when an operation mode of the self-test circuit has been switched from a low-speed operation mode to a high-speed operation mode, processing is performed in the high-speed operation mode during a given time period, and the processing result is invalidated based on a control signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF THE EMBODIMENTS

Prior to detailed description on a control method for a semiconductor integrated circuit and a semiconductor integrated circuit according to each of embodiments, a semiconductor integrated circuit as a comparative example will be explained with reference to FIGS. 1 and 2.

Figure 1:
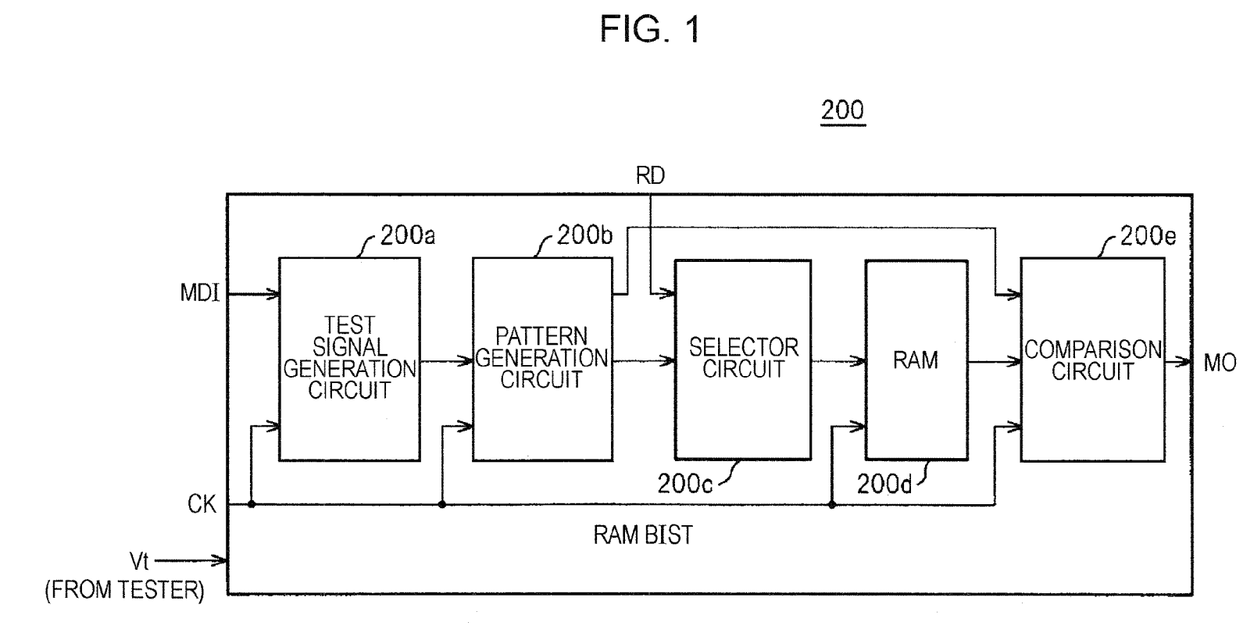
FIG. 1 is a schematic block diagram illustrating a comparative example of RAM BIST circuit in a semiconductor integrated circuit.

FIG. 1 is a schematic block diagram illustrating a comparative example of RAM BIST circuit in a semiconductor integrated circuit. Here, an example of RAM BIST (RAM built-in-self-test) circuit 200 to be mounted on a semiconductor integrated circuit (LSI) is schematically illustrated.

Such a RAM BIST circuit 200 is configured to be plurally mounted on an LSI. Particularly in recent years, the number of RAM BIST circuits 200 mounted on the LSI is rapidly increasing.

As illustrated in FIG. 1, the RAM BIST circuit 200 includes a test signal generation circuit 200a, a pattern generation circuit 200b, a selector circuit 200c, a RAM 200d, and a comparison circuit 200e each of which is supplied with an extraneous clock signal.

A data input signal MDI for RAM BIST is input to the test signal generation circuit 200a, and an output signal MDO indicating a test result is output from the comparison circuit 200e.

The test signal generation circuit 200a, for example, generates various control signals for testing RAM 200d, and the pattern generation circuit 200b generates a test pattern in accordance with an output signal of the test signal generation circuit 200a and a clock signal CK. The selector circuit 200c makes a selection between a test pattern from the pattern generation circuit 200b and a real data pattern RD.

The comparison circuit 200e compares data read from the RAM 200d with data (expected value) on a test pattern from the pattern generation circuit 200b.

As described above, the RAM BIST circuit 200 illustrated in FIG. 1 is configured to be plurally mounted on the LSI, and to usually perform tests using a power supply voltage Vt from a tester (not illustrated).

Figure 2:
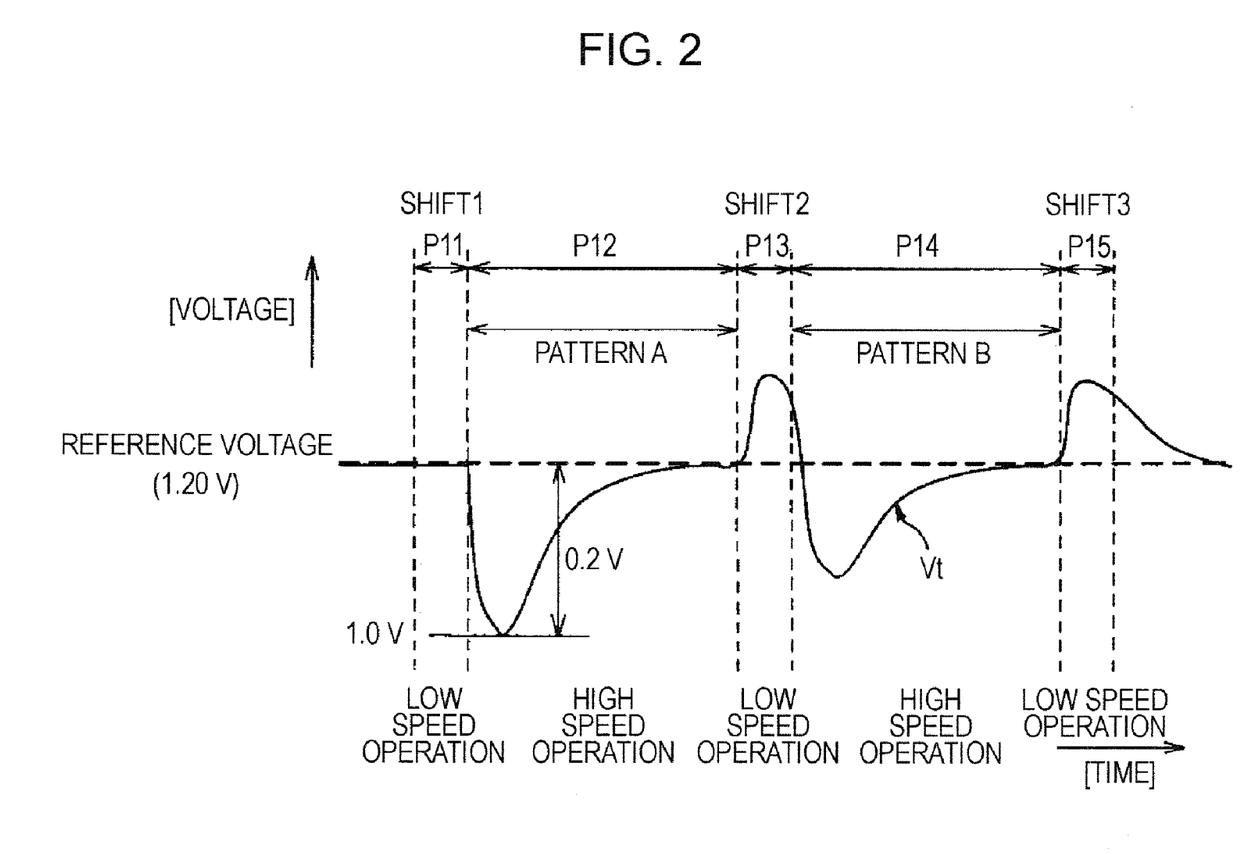
FIG. 2 is a diagram illustrating an example of power supply waveforms by the semiconductor integrated circuit in FIG. 1.

FIG. 2 is a diagram illustrating an example of power supply waveforms by the semiconductor integrated circuit in FIG. 1.

Here, variations in the power supply voltage with 1.20 V as a reference voltage are illustrated.

In FIG. 2, periods P11, P13, and P15 each represent a low-speed operation mode period (low-speed period), and each of them is a period for setting test data for testing the RAM 200d, and/or retrieving a test result from the RAM 200d.

On the other hand, periods P12 and P14 each represent a high-speed operation mode period (high-speed period), and each of them is a period for performing a test using set test data, by operating the RAM 200d, e.g., at a real system's operation speed.

During the period P11, test data for a test pattern A is set, and during the period P12, a test for the RAM 200d by the test pattern A is performed.

Tests for RAMs 200d by the test pattern A are simultaneously performed with respect to a plurality of RAMs 200d (RAM BIST circuits 200) provided in an LSI, using a system's real operation speed (e.g., several hundred MHz).

During the period P13, the retrieval of test results by the test pattern A, and the setting of test data for a test pattern B are performed, and during the period P14, tests for the RAMs 200d by the test pattern B are performed.

During the period P15, the retrieval of test results by the test pattern B is performed.

As illustrated in the low-speed operation mode period P11 in FIG. 2, because the setting of test data is performed, for example, at a low speed (e.g., approximately 10 MHz) by a scan shift, a power supply drop (drop in power supply voltage) hardly occurs. During the period P11, for example, an initial setting such as lock-up of PLL is also performed.

On the other hand, as illustrated in the high-speed operation mode periods P12 and P14 in FIG. 2, for example, when a plurality of RAMs 200d (RAM BIST circuits 200) are simultaneously operated at a high speed (e.g., several hundred MHz) by the power supply voltage Vt from the tester, a large voltage drop occurs.

For example, during the high-speed operation mode period P12, the power supply voltage Vt of the tester drops from the reference voltage 1.20 V during the low-speed operation mode period down to 1.0 V at the first point in the high-speed operation mode period P12 from which point simultaneous tests for a plurality of RAMs 200d are started by the test pattern A.

This is because, since the plurality of RAMs 200d implement the test pattern A by high speed clock signals at several hundred MHz, a large amount of current rapidly flows to cause the power supply drop due to, for example, a power supply response of the tester not arriving in time.

Thereafter, the power supply voltage Vt of 1.0 V gradually rises up to the reference voltage 1.20 V due to the power supply response of the tester. Upon entering the next low-speed operation mode period P13 after having completed drives with respect to the plurality of RAMs 200d by the test pattern A, load current rapidly decreases, so that the power supply voltage Vt shifts toward the high potential side.

Furthermore, the power supply voltage Vt again drops at the first point in the high-speed operation mode period P14 from which point simultaneous tests for a plurality of RAMS 200d are started by the test pattern B. Moreover, the power supply voltage Vt gradually rises up to the reference voltage 1.20 V due to the power supply response of the tester, and shifts toward the high potential side during the next low-speed operation mode period P15.

In this way, in tests by the RAM BIST circuit as a comparative example in the semiconductor integrated circuit, large voltage drops occur when the operation mode switches from the low-speed operation mode periods P11 and P13 to the high-speed operation mode period P12 and 14, respectively. On the other hand, voltage rises occur when the operation mode switches from the high-speed operation mode periods P12 and P14 to the low-speed operation mode periods P13 and 15, respectively.

The above-described variations in power supply voltage due to the variations in power consumption constitute power supply noise. Occurrence of this power supply noise makes it difficult to perform exact tests in the semiconductor integrated circuit.

The above-described problem occurs not merely in tests in which a semiconductor integrated circuit having a plurality of RAM BIST circuits 200 is tested using a power supply voltage from the tester while changing the operation from the low speed operations to the low speed operations, but also may occur in various semiconductor integrated circuit tests.

Hereinafter, a control method for a semiconductor integrated circuit and a semiconductor integrated circuit according to embodiments will be described with reference to the appended drawings.

Figure 3:
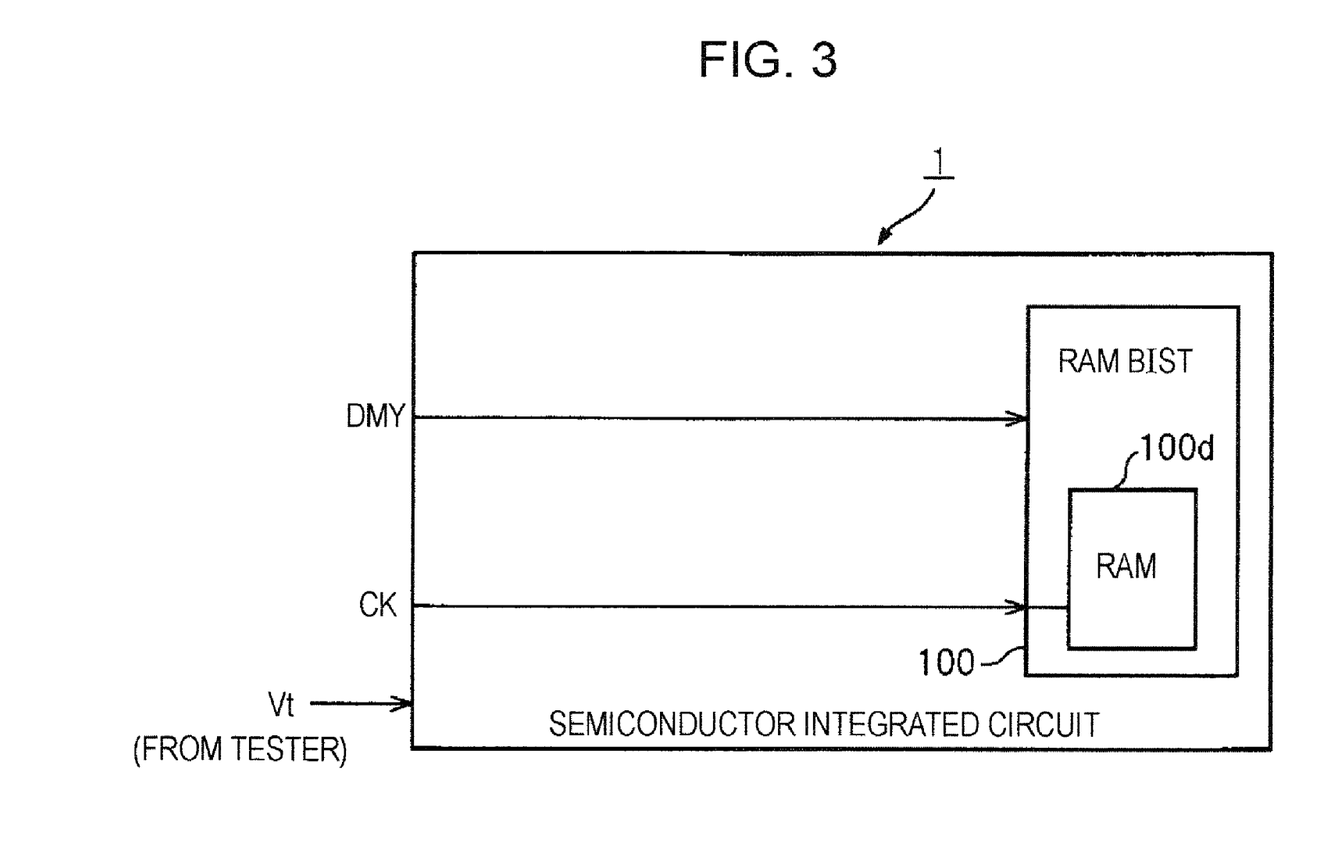
FIG. 3 is a schematic block diagram of a semiconductor integrated circuit according to a first embodiment.

FIG. 3 is a schematic block diagram of a semiconductor integrated circuit according to a first embodiment. In FIG. 3, reference numeral 1 denotes a semiconductor integrated circuit (LSI), reference numeral 100 denotes a RAM BIST circuit, and reference numeral 100d denotes a RAM to be tested.

As illustrated in FIG. 3, the LSI 1 according to the first embodiment is configured so that an extraneous control signal DMY is supplied to the RAM BIST circuit 100, and so that the LSI 1 controls, by the control signal DMY, the processing periods (P2 and P5) in which idle processing patterns are used, these processing periods being described later with reference to FIG. 6.

During each processing period (a given time period) in which an idle processing pattern is used, head data of test data (a test pattern) is generated, and for example, the RAM in the RAM BIST circuit 100 is operated with a fixed address provided.

Alternatively, during each processing period in which an idle processing pattern is used, the RAM in the RAM BIST circuit 100 is operated with an address sequentially varying in the test pattern provided, in the same way as a real test.

That is, the RAM BIST circuit 100 is operated using the head data of each of the test patterns as in the case of a real test, to thereby cause a power supply voltage drop; and when the power supply voltage has been stabilized after each processing period, in which an idle processing pattern has been used, a test by the test pattern is performed.

The RAM BIST circuit 100 is configured to be plurally mounted on the LSI 1, and to perform tests using the power supply voltage Vt from the tester (not illustrated).

Figure 4:
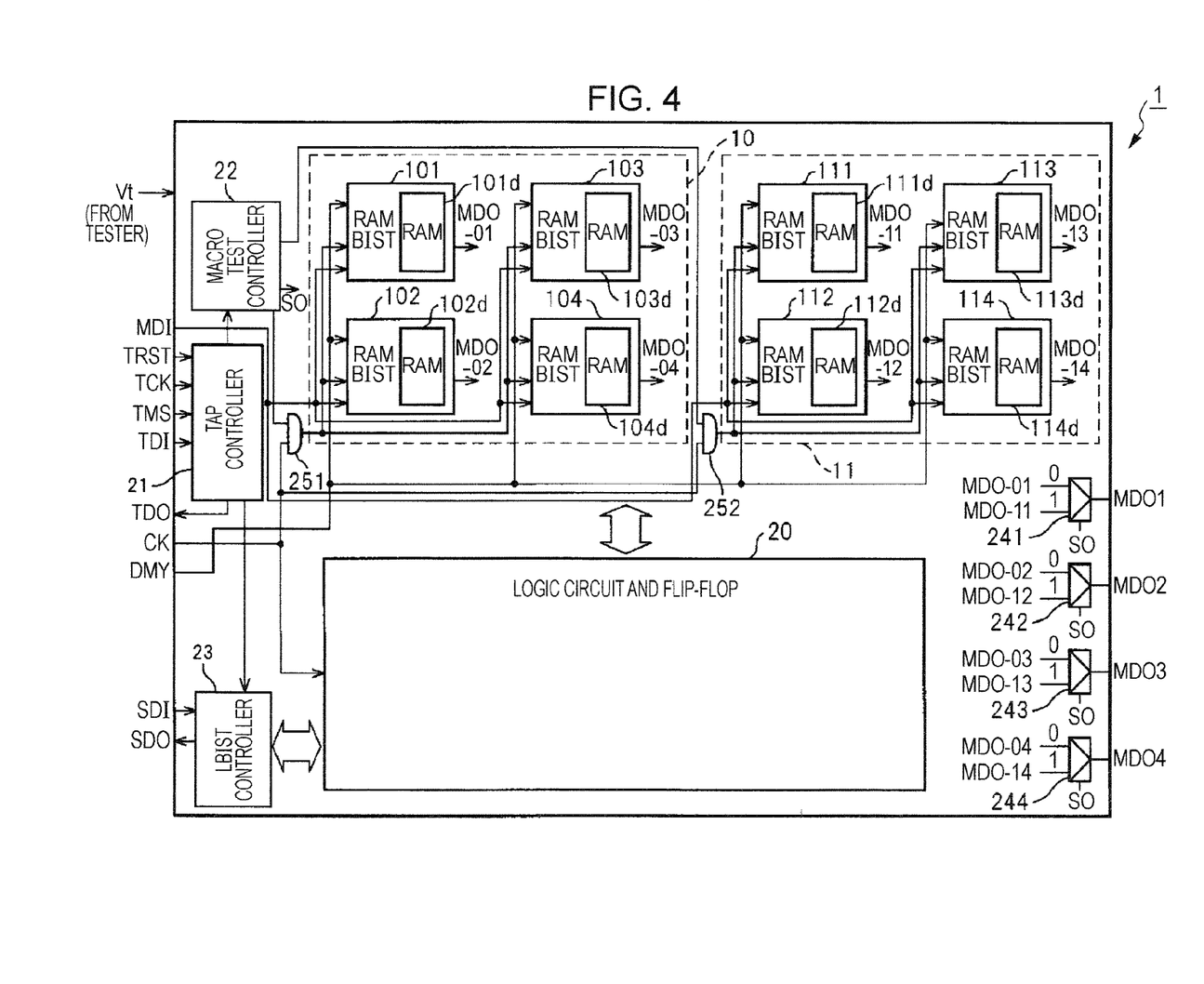
FIG. 4 is a detailed block diagram illustrating an example of the semiconductor integrated circuit in FIG. 3.

FIG. 4 is a block diagram illustrating the overall configuration of an example of the semiconductor integrated circuit to which the first embodiment is applied.

As illustrated in FIG. 4, the LSI 1 includes a plurality of RAM BIST circuits 101 to 104 and 111 to 114, a test access port (TAP) controller 21, a macro test controller 22, and a logic BIST (LBIST) controller 23.

The LSI 1 further includes a logic circuit and flip-flop (FF) 20, a plurality of selectors 241 to 244, and AND-gates 251 and 252.

Here, the RAM BIST circuits 101 to 104 and 111 to 114 are divided into a simultaneous test groups 10 and 11, respectively.

That is, for example, the RAM BIST circuits 101 to 104 are adapted to simultaneously perform tests by an output of the AND-gate 251, while the RAM BIST circuits 111 to 114 are adapted to simultaneously perform tests by an output of the AND-gate 252.

A control signal DMY is supplied to each of the RAM BIST circuits 101 to 104, and 111 to 114. When the operation mode has been switched from a first operation mode to a second operation mode, processing in the second mode is performed during a given time period and the processing result is invalidated (ignored) by the control signal DMY.

Here, the first operation mode is a low-speed operation mode in which the setting of data for testing the RAMS 101$d$ to 104$d$, and 111$d$ to 114$d$, and/or the retrieval of test results from the RAMs 101$d$ to 104$d$, and 111$d$ to 114$d$, are performed.

On the other hand, the second operation mode is a high-speed operation mode in which the RAMs 101$d$ to 104$d$, and 111$d$ to 114$d$ are tested by operating them at the operating frequency of the LSI 1, using set test data.

A data input signal MDI for RAM BIST is supplied to each of the RAMs 101$d$ to 104$d$, and 111$d$ to 114$d$.

Out of a group of MDO-01 to MDO-04 and a group of MDO-11 to MDO-14, which are, respectively, groups of test results obtained from the RAM BIST circuits 101 to 104 and 111 to 114, one group is selected by selectors 241 to 244, and is extracted to the outside of the LSI 1 as test results MDO-01 to MDO-04.

The TAP controller 21, for example, receives, from the tester, a reset signal TRST, a clock signal TCK, a state transition signal TMS, and a test data input signal TDI each for use in the TAP controller, and controls a macro test controller 22 and an LBIST controller 23. Here, a tap controller test data output signal TDO is output from the TAP controller 21.

The macro test controller 22 receives the output signal TDO from the TAP controller 21, and controls AND-gates 251 and 252, to thereby control the supply of the clock signal CK to the simultaneous test group 10 or 11.

The LBIST controller 23, for example, upon receipt of a scan data input signal SDI, performs a test for a logic circuit-flip flop 20, and outputs a scan data output signal SDO.

The semiconductor integrated circuit illustrated in FIG. 4 is merely one example of semiconductor integrated circuit to which the first embodiment is applied, and may be applicable to various semiconductor integrated circuits.

Figure 5:
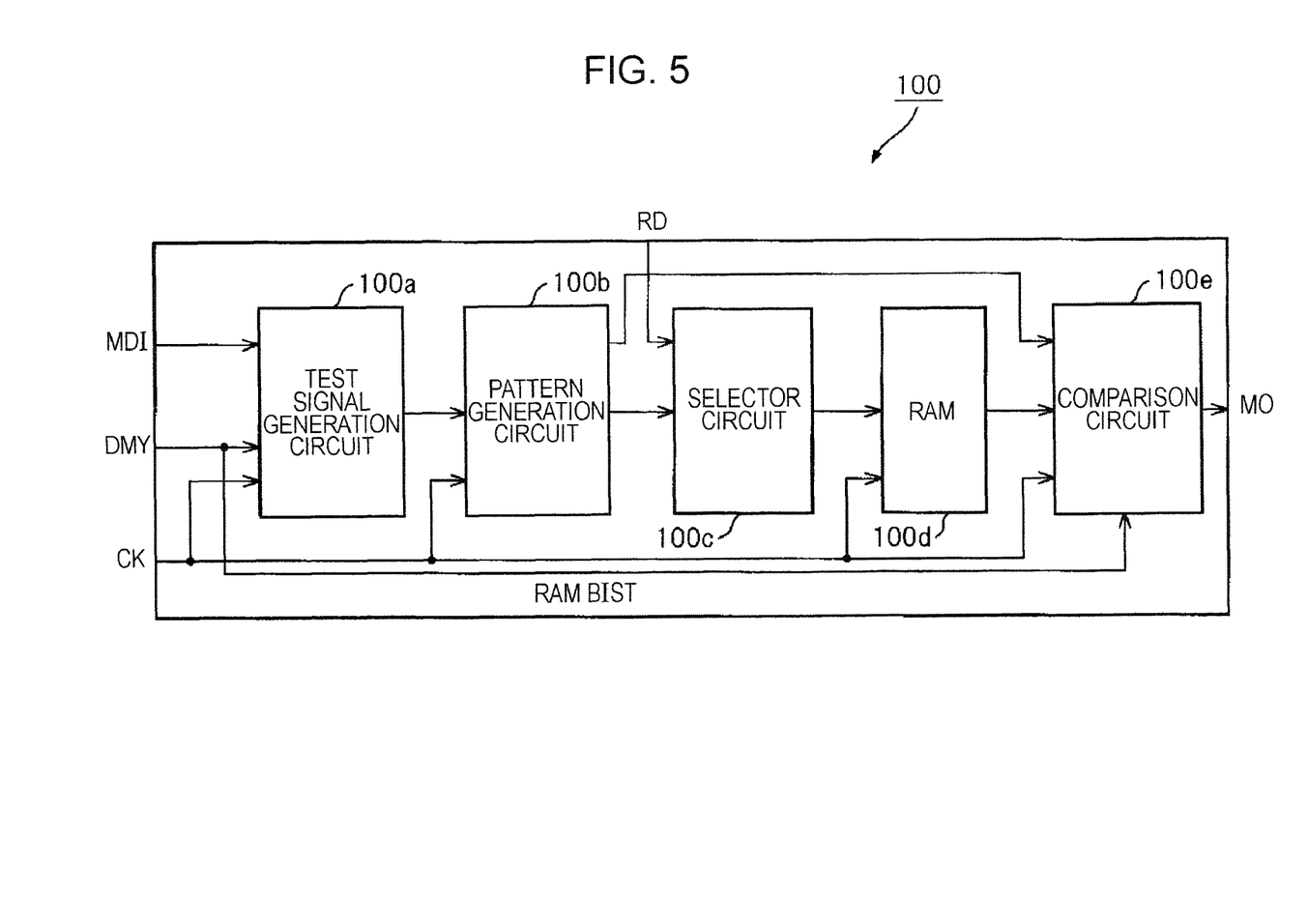
FIG. 5 is a schematic block diagram illustrating an example of a RAM BIST circuit in the semiconductor integrated circuit in FIG. 3.

FIG. 5 is a schematic block diagram illustrating an example of RAM BIST circuit in the semiconductor integrated circuit according to this embodiment. The RAM BIST circuit 100 in FIG. 5 corresponds to each of the RAM BIST circuits 101 to 104, and 111 to 114 in FIG. 4.

As illustrated in FIG. 5, the RAM BIST circuit 100 includes a test signal generation circuit 100$a$, a pattern generation circuit 100$b$, a selector circuit 100$c$, a RAM 100$d$, and a comparison circuit 100$e$, each of which is supplied with an extraneous clock signal.

A data input signal MDI for RAM BIST is input to the test signal generation circuit 100$a$, and an output signal MDO indicating a test result is output from the comparison circuit 100$e$.

As illustrated in FIG. 3, as the control signal DMY, a signal supplied from the outside of the LSI 1 may be used just as is. However, as illustrated later in FIGS. 9 and 10, a signal generated inside the LSI 1 may also be used.

The test signal generation circuit 100$a$, for example, generates various control signals for testing the RAM 100$d$, and the pattern generation circuit 100$b$ generates a test pattern in accordance with an output signal from the test signal generation circuit 100$a$ and a clock signal CK.

The selector circuit 100$c$ makes a selection between the test pattern from the pattern generation circuit 100$b$ and a real data pattern RD. Here, the RAM 100$d$ to be tested is, for example, a static RAM (SRAM) having a memory cell with six transistors, but may be any other RAM.

The comparison circuit 100$e$ compares data read from the RAM 100$d$ with data on a test pattern from the pattern generation circuit 100$b$. That is, after having written the test pattern in the RAM 100$d$, the comparison circuit 100$e$ compares the data read from the RAM 100$d$ with data on an original test pattern (expected value).

The comparison circuit 100$e$ is supplied with a control signal DMY, and for example, as will be described later, during the processing period P2, in which the idle processing pattern is used, the output of the comparison circuit 100$e$ is stopped so as not to output a test result.

That is, for example, during the processing period P2, in which the idle processing pattern is used, the RAM 100$d$ is operated with a sequentially varying address provided as in the case of a real test, and then the processing result is invalidated (i.e., the test result is not recorded).

As described with reference to FIG. 4, the RAM BIST circuit 100 illustrated in FIG. 5 is configured to be plurally mounted on the LSI, and to perform tests using the power supply voltage Vt from the tester (not illustrated).

Figure 6:
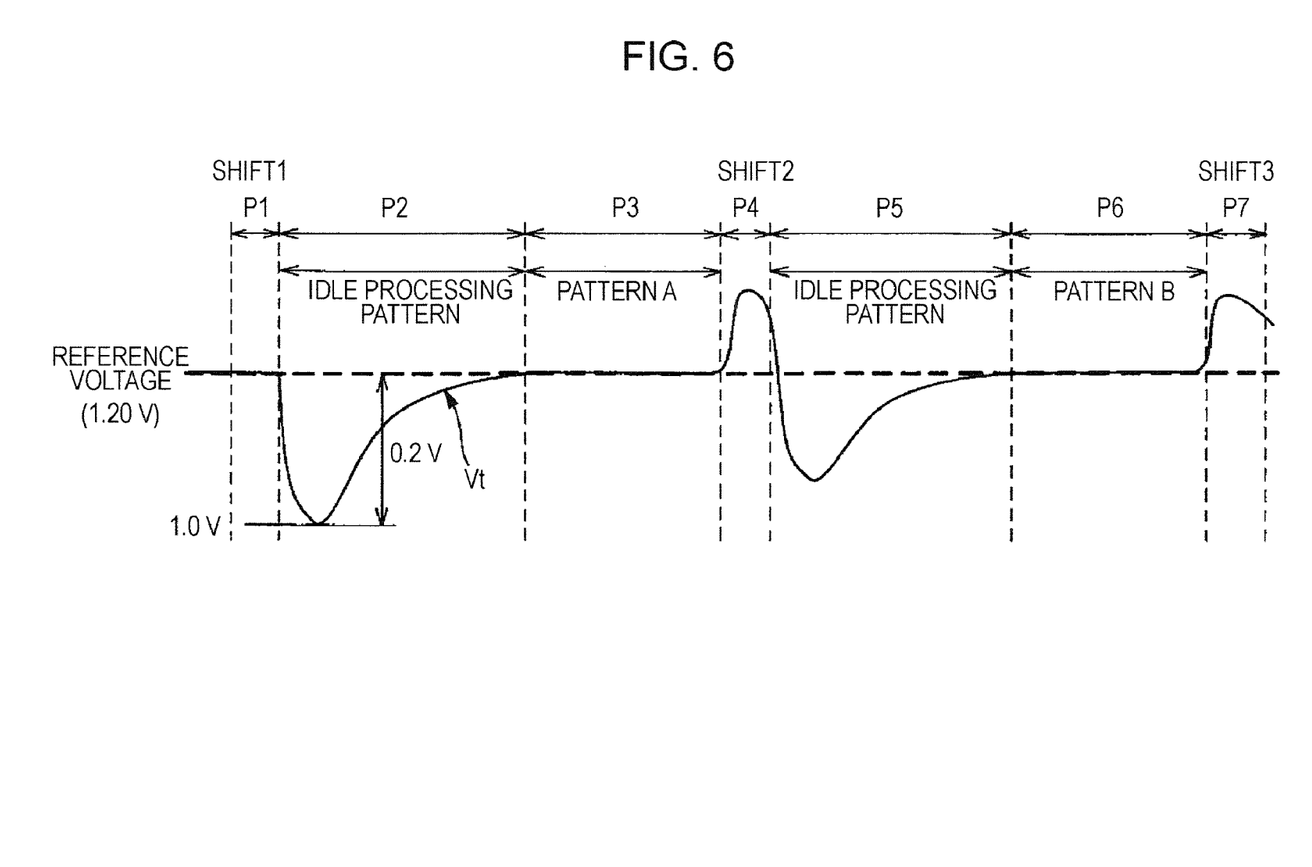
FIG. 6 is a diagram illustrating an example of power supply waveforms by the semiconductor integrated circuit in FIG. 5.

FIG. 6 is a diagram illustrating an example of power supply waveforms by the semiconductor integrated circuit in FIG. 5. Here, illustrated are variations in the power supply voltage with 1.20 V as a reference voltage.

In FIG. 6, periods P1, P4, and P7 each represent a low-speed operation mode period (low-speed period), and each of them is a period for setting test data for testing the RAM 100$d$ and/or retrieving a test result from the RAM 100$d$. During the period P1, for example, an initial setting such as lock-up of PLL is also performed.

Periods P2, P3, and P5, and P6 each represent a high-speed operation mode period (high-speed period), and each of them is, for example, a period for performing a test by operating the RAM 100$d$ at the system's real operating speed. Here, the processing periods P2 and P5 each represent a processing period in which an idle processing pattern is used, while the periods P3 and P6 represent processing periods in which the test patterns A and B are used, respectively.

That is, during the pattern P1, test data for the test pattern A is set; during the pattern P2, the RAM 100$d$ is driven by the idle processing pattern; and during the pattern P3, a real test for the RAM 100$d$ by the test pattern A is performed.

Here, the RAM BIST circuit 100 is configured to be plurally mounted on the LSI 1, and for example, to perform tests using the power supply voltage Vt.

As described above, during the processing periods (given periods) P2 and P5, in which idle processing patterns are used, for example, head data of the test patterns A and B is generated, respectively, and the RAM 100$d$ is operated with a fixed address provided.

During each of the processing periods P2 and P5, in each of which an idle processing pattern is used, the RAM 100$d$ is operated by the fixed address, but since a drop in the power supply voltage Vt occurs, the processing result during each of the periods P2 and P5 is invalidated.

In other words, during each of the processing periods P2 and P5, in each of which idle processing patterns are used, the RAM 100$d$ is operated using the fixed address, but since the drop in the power supply voltage Vt takes place, the processing result during each of the periods P2 and P5 is ignored.

Then, after the processing periods P2 and P5, in which idle processing patterns are used for stabilizing the power supply voltage, have elapsed, tests by the test patterns A and B are performed during the periods P3 and P6, respectively.

Thus, in the first embodiment, during each of the given periods, the idle processing is performed by the head data of the test pattern, and a RAM test is started from the test pattern's head data, by which the RAM test is performed through the idle processing.

In this manner, according to the first embodiment, for example, since a real RAM test is performed from each of the processing periods 3 and 6, in which the power supply voltage from the tester has been stabilized, it may be possible to perform exact tests without being affected by power supply noise due to variations in power consumption.

As a result, lower yield rates due to test results or improper tests caused by the effect of power supply noise due to a small power supply capacity from the tester are unlikely to occur.

The above-described embodiment is not limited to tests for an LSI equipped with a plurality of RAM BIST circuits, but also applicable to the control of various semiconductor integrated circuits. Also, the above-described effects may be produced in the first embodiment as well as in second and third embodiments (to be described later).

Figure 7:
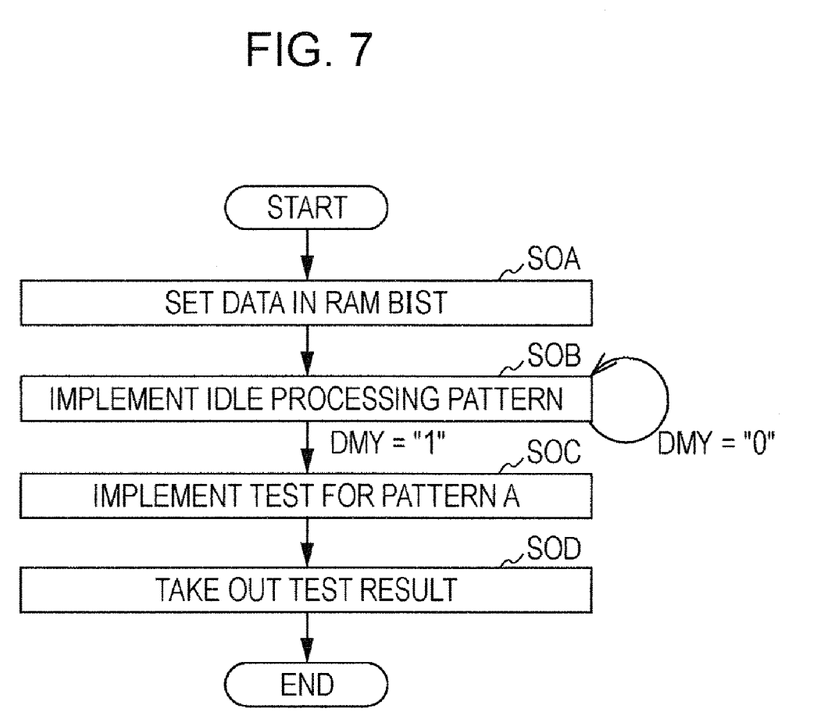
FIG. 7 is a flowchart explaining control processing for the semiconductor integrated circuit in FIG. 5.

FIG. 7 is a flowchart explaining control processing for the semiconductor integrated circuit in FIG. 5. Here, illustrated is an example of test processing for RAM BIST circuit.

As illustrated in FIG. 7, firstly, upon start of test processing, in operation SOA, for example, the setting of test data for testing the RAM 100d during the period P1 in FIG. 6 is performed.

Next, in operation SOB, for example, the idle processing pattern during the period P2 is implemented.

Due to this idle processing pattern, the power supply voltage Vt drops, for example, from the reference voltage 1.20 V down to 1.0 V at the first point during the period P2, but thereafter, the power supply voltage Vt is restored and returns to nearly the reference voltage 1.20 V at the last point during the period P2.

As described above, the idle processing pattern is not limited to a pattern that operates the RAM 100d by the above-described fixed address, but for example, a pattern that operates the RAM 100d upon providing a sequentially varying address thereto, as in the case of a real test, may also be employed.

Then, in operation SOC, for example, a test by the pattern A during the period P3 in FIG. 6 is performed. At this time, since the power supply voltage Vt has become nearly the reference voltage (1.20 V), the test by the test pattern A may be performed correctly.

For example, during the high-speed operation mode periods P2 and P3, in the processing period P2, in which an idle processing pattern is used, the control signal is set to DMY="0" so as to ignore a test result, while in the period P3, the control signal is set to DMY="1" so as to record the test result.

During the idle processing period P2, for example, as has been described with reference to FIG. 5, the output of the comparison circuit 100e is stopped so as not to output the test result.

Then, in operation SOD, for example, the retrieval of a test result by the test pattern A during the period P4 in FIG. 6, and the setting of test data of the test pattern B are performed. Then, also with respect to the test pattern B, the implementation (corresponding to SOB) of a similar idle processing pattern, and the implementation (corresponding to SOB) of the test pattern B are performed.

In the description with respect to FIG. 7, each of the operations SOA to SOC may also be "steps".

Figure 8:
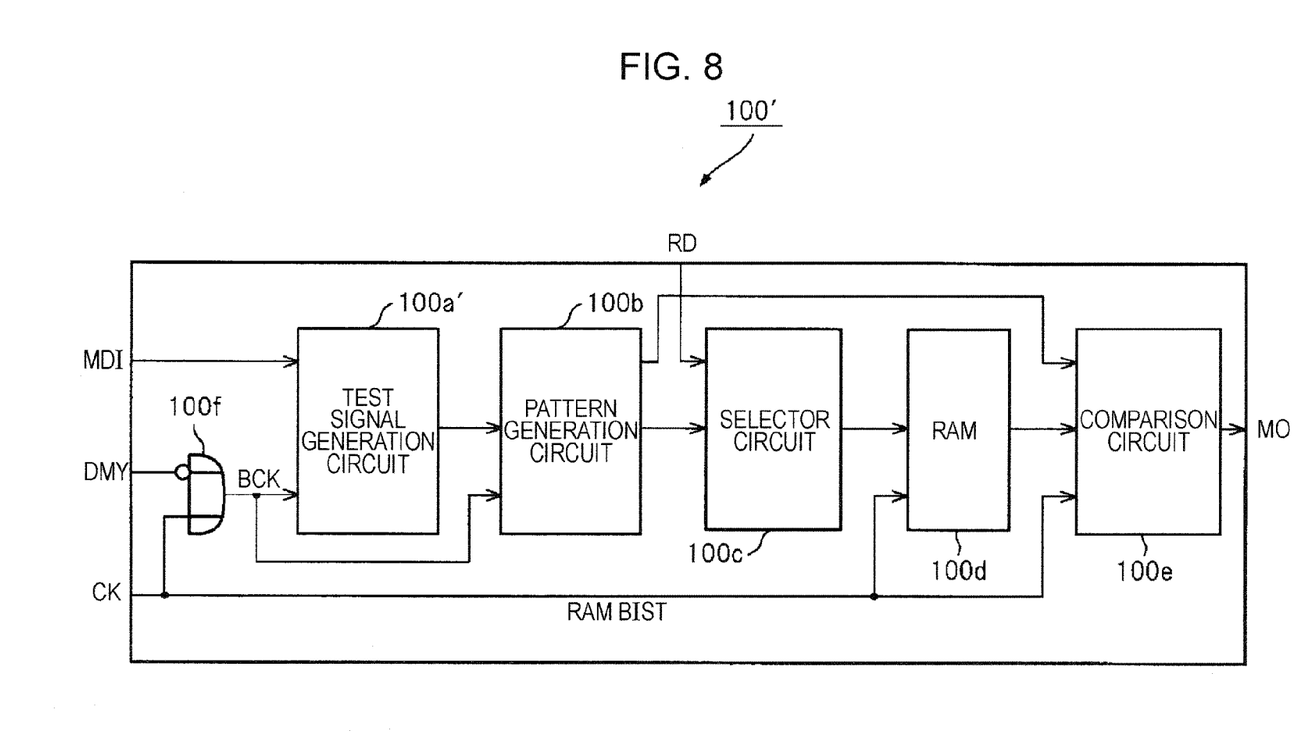
FIG. 8 is a schematic block diagram illustrating another example of RAM BIST circuit in the semiconductor integrated circuit in FIG. 3.

FIG. 8 is a schematic block diagram illustrating another example of RAM BIST circuit in the semiconductor integrated circuit according to this embodiment.

As is evident from the comparison between FIG. 8 and FIG. 5 illustrated above, a RAM BIST circuit 100' in FIG. 8 further includes an OR-gate 100f. An inversion signal of the control signal DMY is supplied to one input of the OR-gate 100f, while a clock signal CK is input to the other input thereof.

Output signals of the OR-gate 100f are supplied as clock signals to a test signal generation circuit 100a', the pattern generation circuit 100b, the selector circuit 100c, the RAM 100d, and the comparison circuit 100e.

As a result, when the control signal becomes DMY="0" during the processing periods P2 and P5 in which idle processing patterns are used, the output signal of the OR-gate 100f becomes "1", and is supplied to the test signal generation circuit 100a', the pattern generation circuit 100b, the selector circuit 100c, the RAM 100d, and the comparison circuit 100e.

That is, for example, during the processing periods P2, in which an idle processing pattern is used, the RAM 100d is driven by the fixed address of the head data of test data.

When the control signal becomes DMY="1" during the periods 3 and 6, the output signal of the OR-gate 100f makes up a clock signal, and thus tests by the test patterns A and B are performed.

Figure 9:
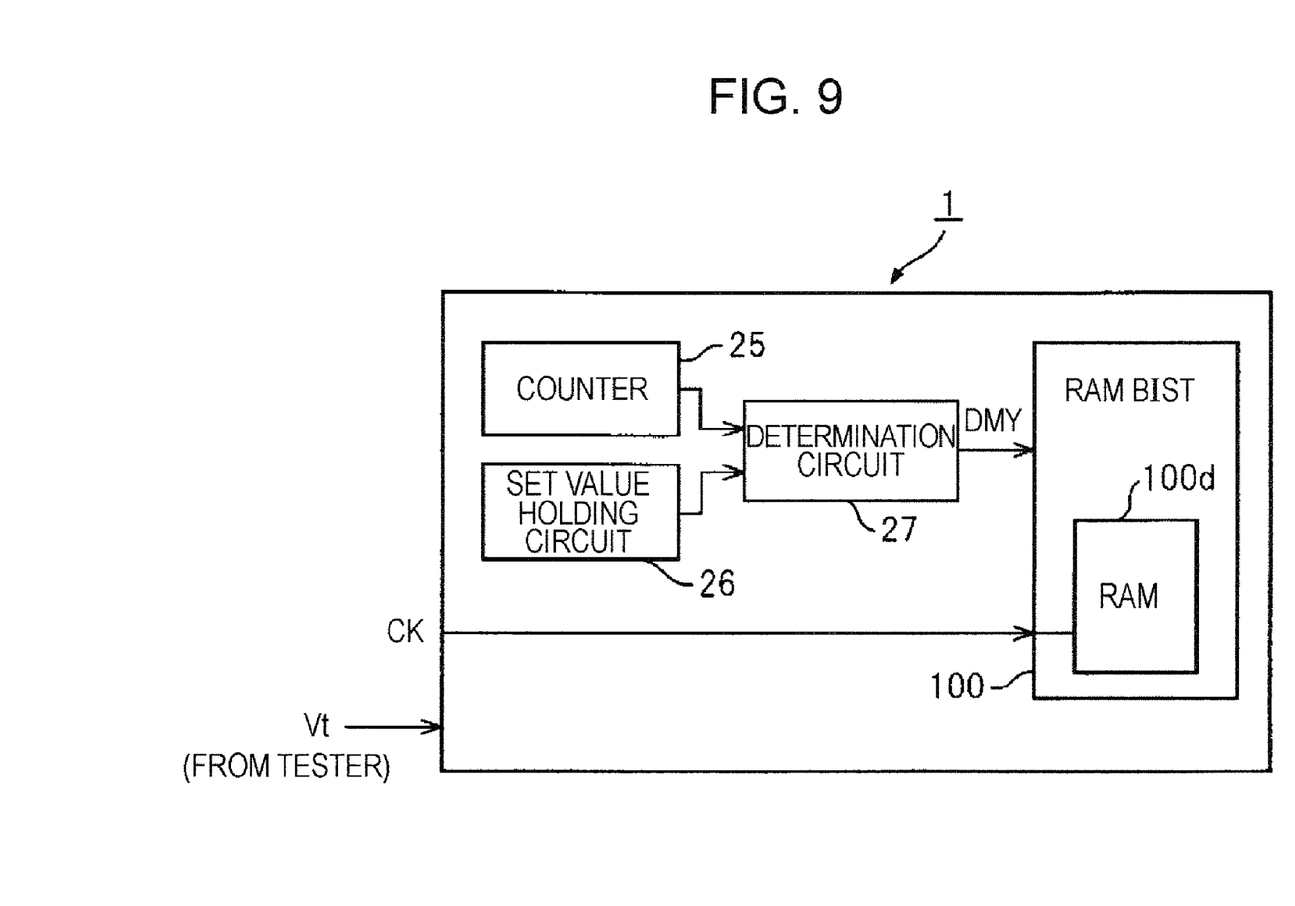
FIG. 9 is a schematic block diagram of a semiconductor integrated circuit according to a second embodiment.

FIG. 9 is a schematic block diagram of a semiconductor integrated circuit according to a second embodiment.

As illustrated in FIG. 9, an LSI 1 according to the present second embodiment includes a RAM BIST circuit 100, a counter 25, a set value holding circuit 26, and a determination circuit 27.

The value to be set in the set value holding circuit 26 corresponds to a value counted by the counter 25 as a time period corresponding to the above-described processing period P2 (P5) in which an idle processing pattern is used. In the set value holding circuit 26, for example, a value allowing the power supply voltage Vt to be stabilized during the period P2 (P5) is set in consideration of a power supply device of the tester used for tests.

Thus, in the LSI 1 according to the second embodiment, the control signal DMY (DMY="0") is output from a point in time when the operation mode has been switched from the low-speed operation mode to the high-speed operation mode until the determination circuit 27 determines that the value of the counter 25 has become a set value of the set value holding circuit 26.

Figure 10:
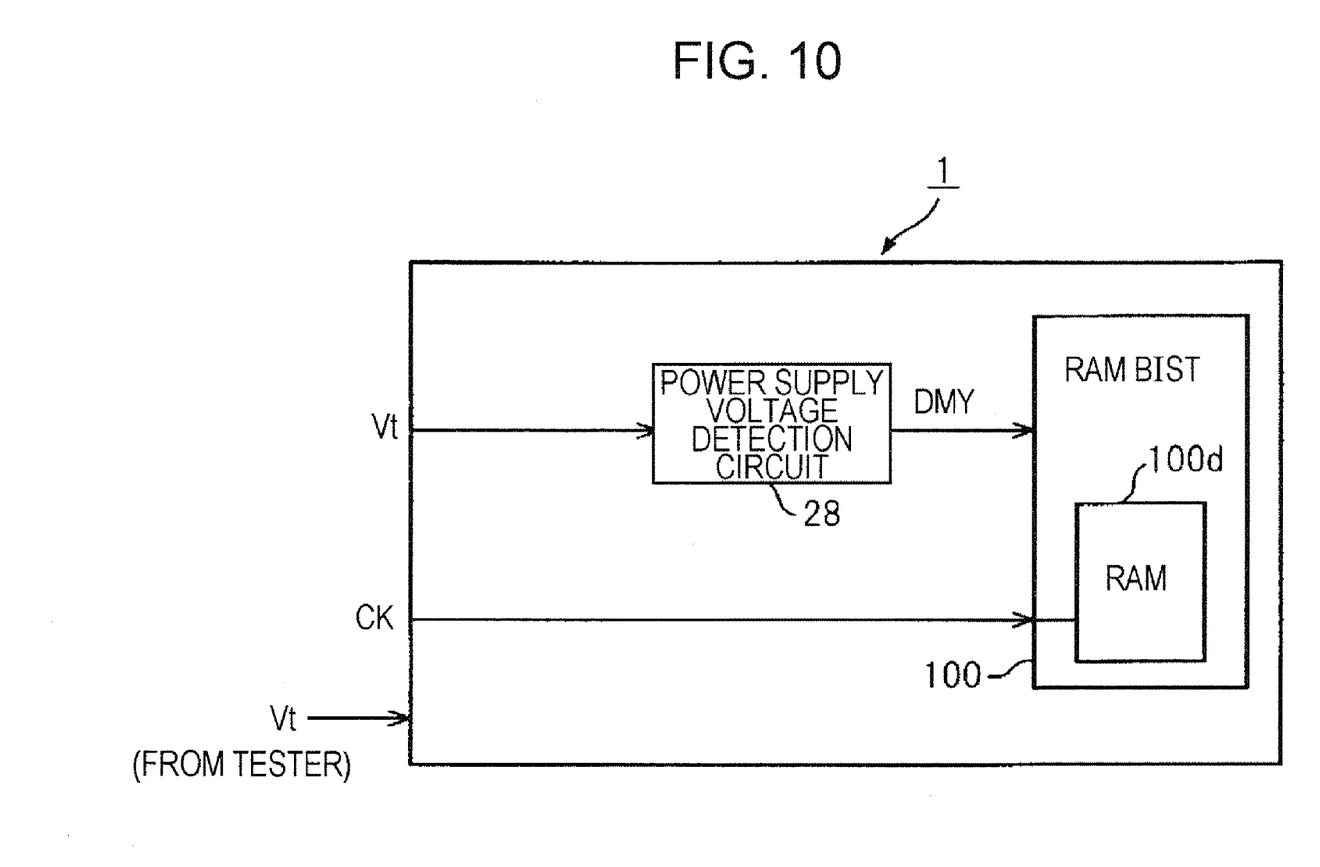
FIG. 10 is a schematic block diagram of a semiconductor integrated circuit according to a third embodiment.

FIG. 10 is a schematic block diagram of a semiconductor integrated circuit according to a third embodiment. As illustrated in FIG. 10, an LSI 1 according to the present third embodiment includes a RAM BIST circuit 100, and a power supply voltage detection circuit 28 for detecting the level of the power supply voltage Vt.

In the LSI 1 according to the third embodiment, the control signal DMY (DMY="0") is output from a point in time when the operation mode has been switched from the low-speed operation mode to the high-speed operation mode until the power supply voltage detection circuit 28 detects that the level of the power supply voltage Vt has become the reference voltage (e.g., 1.20 V).

As described above, according to the present third embodiment, for example, when testers mutually different in the power supply capacity are used, even if the testers are different in the power supply voltage Vt dropping characteristic and the reference voltage restoring characteristic, it may be possible to perform a test using the set value as is without changing the set value.

In the second and third embodiments, as a RAM BIST circuit, the RAM BIST circuit 100 in FIG. 5 or the RAM BIST circuit 100' in FIG. 8 may be utilized as they are. Furthermore, the timing for switching from the low-speed operation mode to the high-speed operation mode may be determined by, for example, an output signal (state signal) of the TAP controller 21 in FIG. 4.

The above-described case in which the drop in the power supply voltage from the tester occurs when switching the operation mode from the low-speed operation mode to the high-speed operation mode is merely an example. The above-described embodiments may be extensively applied to control various semiconductor integrated circuits.

According to the embodiments, influences of power supply noise due to variations in the power consumption are reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments have been described in detail, it should be understood that the various changes, substitutions, and alterations could be made hereto without departing from the spirit and scope of the invention.

What is claimed is:

1. A semiconductor integrated circuit comprising:
   a self-test circuit, wherein, when an operation mode of the self-test circuit has been switched from a low-speed operation mode to a high-speed operation mode, processing is performed in the high-speed operation mode during a given time period, and a processing result is invalidated based on a control signal.

2. The semiconductor integrated circuit according to claim 1, wherein the low-speed operation mode is an operation mode in which the setting of test data for testing the self-test circuit, or the retrieval of a test result from the self-test circuit is performed; and wherein the high-speed operation mode is an operation mode in which the self-test circuit is operated by the test data.

3. The semiconductor integrated circuit according to claim 2, further comprising:
   a counter;
   a set value holding circuit that holds a set value of the counter; and
   a determination circuit that determines whether a count value of the counter coincides with a value set in the set value holding circuit,
   wherein the control signal is output from a point in time when the operation mode has been switched from the low-speed operation mode to the high-speed operation mode until the determination circuit determines the coincidence.

4. The semiconductor integrated circuit according to claim 3, further comprising:
   a power supply voltage detection circuit that detects the level of a power supply voltage of the self-test circuit,
   wherein the control signal is output from a point in time when the operation mode has been switched from the low-speed operation mode to the high-speed operation mode until the power supply voltage detection circuit detects that the level of the power supply voltage has returned to a reference voltage.

5. The semiconductor integrated circuit according to claim 2, wherein the self-test circuit is a RAM BIST circuit; wherein the RAM BIST circuit comprises:
   a RAM to be tested;
   a test signal generation circuit that, upon receipt of the control signal and a clock signal, generates a BIST control signal; a pattern generation circuit that, upon receipt of an output signal of the test signal generation circuit, generates patterns of address data for the RAM, patterns of write data, and patterns of expected value data;
   a selection circuit that, upon receipt of an output signal of the pattern generation circuit, makes a selection among a user signal, the address data, and the write data; and
   a comparison circuit that compares an output signal of the RAM with the expected value data.

6. The semiconductor integrated circuit according to claim 5, wherein, during the given time period, the pattern generation circuit generates head data of the test data to thereby operate the RAM upon providing a fixed address to the RAM.

7. The semiconductor integrated circuit according to claim 5, wherein, during the given time period, the pattern generation circuit generates the test data to thereby operate the RAM upon providing a sequentially varying address to the RAM.

8. The semiconductor integrated circuit according to claim 5, further comprising a logic circuit that exchanges data with the RAM.

9. The semiconductor integrated circuit according to claim 1, wherein the semiconductor integrated circuit receives a supply of a power supply voltage from a tester; and wherein the given time period is a time period from a point in time when the operation mode has been switched from the low-speed operation mode to the high-speed operation mode until a fluctuating voltage is stabilized.

10. A control method for a semiconductor integrated circuit, the method comprising:
    performing processing in the second operation mode during a given time period when the operation mode has been switched from a first operation mode with a first power consumption to a second operation mode with a second power consumption different from the first power consumption; and
    invalidating the processing result in the second operation mode based on a control signal.

11. The control method for a semiconductor integrated circuit according to claim 10, wherein the semiconductor integrated circuit receives a supply of a power supply voltage from a tester;
    wherein the second power consumption is larger than the first power consumption; and
    wherein the given time period is a time period from a point in time when the operation mode has been switched from the low-speed operation mode to the high-speed operation mode until a fluctuating voltage is stabilized.

12. The control method for a semiconductor integrated circuit according to claim 11, wherein the first operation mode is a low-speed operation mode in which the setting of test data for testing a test target circuit provided in the semiconductor integrated circuit, or the retrieval of a test result from the test target circuit, is performed; and
    wherein the second operation mode is a high-speed operation mode in which the test target circuit is tested using the set test data by operating the test target circuit at an operating frequency of the semiconductor integrated circuit.

13. The control method for a semiconductor integrated circuit according to claim 12, wherein the test target circuit has a self-test circuit,
    wherein, during the given time period, the self-test circuit is operated with the set test data provided, and the test result of the self-test circuit is invalidated; and wherein, after the given time period in the high-speed operation mode has elapsed, the self-test circuit is operated with the test data provided, and the test result of the self-test circuit is held.

14. The control method for a semiconductor integrated circuit according to claim 13, wherein the self-test circuit is a RAM BIST circuit; and wherein, during the given time period, for the RAM BIST circuit, head data of the test data is provided to a fixed address to thereby operate a RAM in the RAM BIST circuit.

15. The control method for a semiconductor integrated circuit according to claim 13, wherein the self-test circuit is the RAM BIST circuit; and wherein, during the given time period, for the RAM BIST circuit, the test data is provided to a sequentially varying address to thereby operate the RAM in the RAM BIST circuit.

16. The control method for a semiconductor integrated circuit according to claim 13, wherein the given time period is defined by a control signal supplied from the outside of the semiconductor integrated circuit.

17. The control method for a semiconductor integrated circuit according to claim 13, wherein the given time period is defined by a control signal generated inside the semiconductor integrated circuit.

18. The control method for a semiconductor integrated circuit according to claim 12, wherein the control signal is output at a preset time.

19. The control method for a semiconductor integrated circuit according to claim 12, wherein, after the operation mode has been switched from the low-speed operation mode to the high-speed operation mode and thereby a drop of the power supply voltage of the self-test circuit has been detected, the control signal is output upon completion of the power supply voltage drop.

20. A control method for a semiconductor integrated circuit, the method comprising:
    performing, for a storage device, processing including address setting with respect to the storage device during a given time period, when the operation mode has been switched from a first operation mode with a first power consumption to a second operation mode with a second power consumption different from the first power consumption; and
    when a processing result based on the address setting has been output in a tester capable of supplying a power supply voltage to the semiconductor integrated circuit, invalidating the processing result in the tester.

* * * * *